(12) United States Patent
Ling (10) Patent No.: US 8,267,369 B2
(45) Date of Patent: Sep. 18, 2012

(54) FAN-FIXING DEVICE

(75) Inventor: Miao-Hung Ling, Taipei County (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 253 days.

(21) Appl. No.: 12/762,598

(22) Filed: Apr. 19, 2010

(65) Prior Publication Data

US 2010/0264293 A1    Oct. 21, 2010

(30) Foreign Application Priority Data

Apr. 20, 2009 (TW) ................................. 98206496 U (51) Int. Cl.
    *A47G 29/00*      (2006.01)
(52) U.S. Cl. .................. 248/689; 248/674; 248/220.41; 248/231.9; 416/244 R; 361/679.48; 361/695
(58) Field of Classification Search .................. 248/689, 248/672, 674, 681, 27.3, 174, 213.4, 220.31, 248/220.41, 222.11, 231.9; 416/244 R; 361/678, 361/679.46, 679.48, 695
See application file for complete search history.

(56) References Cited

U.S. PATENT DOCUMENTS

| | | | | |
|---|---|---|---|---|
| 5,348,268 A * | 9/1994 | Klein | ............................. | 248/681 |
| 6,373,698 B1 * | 4/2002 | Christensen | ................. | 361/695 |
| 6,999,313 B2 * | 2/2006 | Shih | ............................... | 361/695 |
| 7,385,814 B1 * | 6/2008 | Chen | .............................. | 361/695 |
| 7,411,788 B2 * | 8/2008 | Liang | ........................... | 361/695 |
| 7,548,422 B2 * | 6/2009 | Hsieh | ............................ | 361/695 |
| 7,599,179 B2 * | 10/2009 | Chen et al. | .............. | 361/679.48 |
| 2003/0231466 A1 * | 12/2003 | Huang | ......................... | 361/687 |
| 2006/0285292 A1 * | 12/2006 | Fan et al. | ...................... | 361/695 |
| 2008/0014093 A1 * | 1/2008 | Fan et al. | ................. | 416/244 R |
| 2008/0025848 A1 * | 1/2008 | Wu et al. | .................. | 416/244 R |
| 2009/0021912 A1 * | 1/2009 | Yin | ................. | 361/695 |

FOREIGN PATENT DOCUMENTS

TW      M296593      8/2006

\* cited by examiner

*Primary Examiner* — Bradley Duckworth
(74) *Attorney, Agent, or Firm* — Rosenberg, Klein & Lee (57) ABSTRACT

A fan-fixing device for fixing a fan on an installation panel which has a plurality of holes includes a body, a driving part and an elastic assembly. The body has a fixing portion for fixing the fan, at least one track is formed on a side thereof, and at least one first combined part is disposed on an opposite side thereof, wherein the combined part penetrates at least one of the holes. The driving part slidably disposed on the track. The driving part further has at least one second combined part, which penetrates at least another one of the holes. The elastic assembly is arranged between the body and the driving part. As a result, the first combined part and the second combined part can be fixed in the holes via force pushing the driving part, and can be departed from the holes via releasing the force.

8 Claims, 12 Drawing Sheets

FAN-FIXING DEVICE

BACKGROUND OF THE INVENTION

1. Field of the Invention

The present invention relates to a fan-fixing device. In particular, the present invention relates to a fan-fixing device which can fix at least one fan on an installation panel.

2. Description of Related Art

Figure 1:
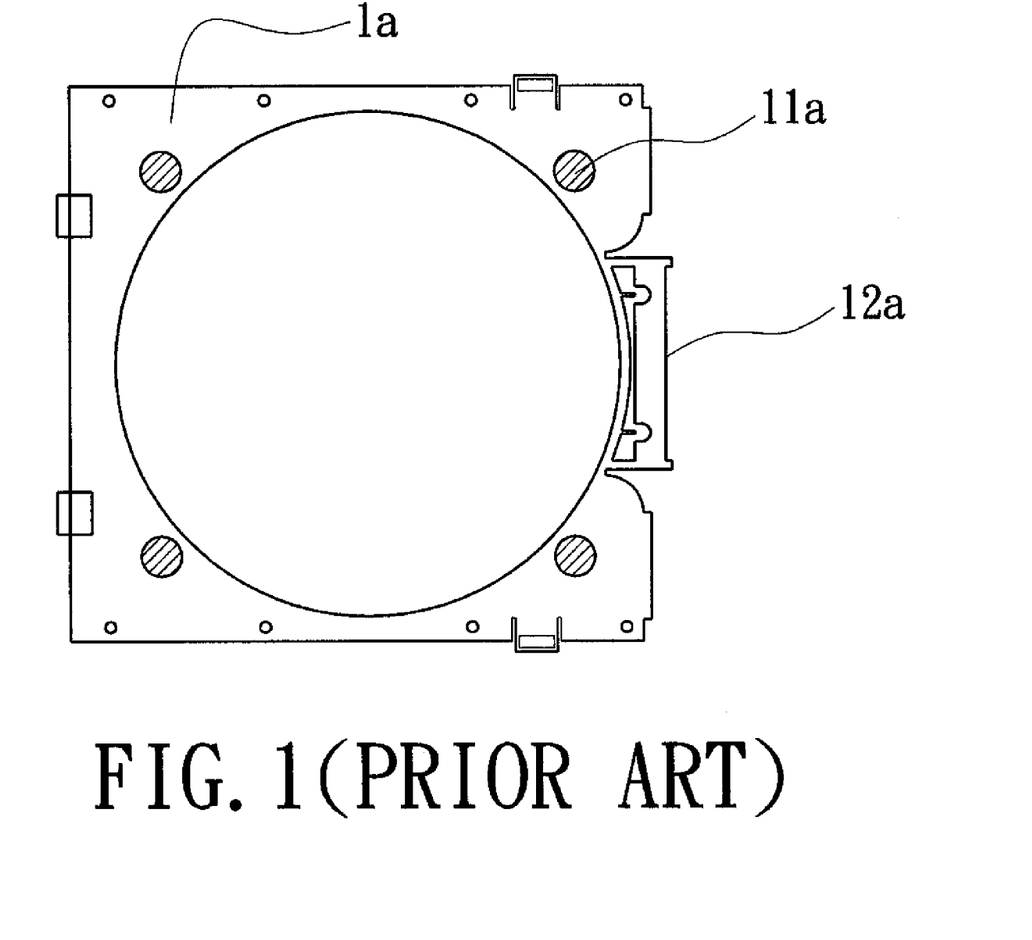
FIG. 1 is a schematic view showing a traditional fan frame.

With increasing of cooling request for modern electronic products, it produces an large number of kinds of heat-dissipating devices as solutions. The heat-dissipating devices can use a fan for heat dissipating. In tradition, the electronic products are dissipated heat via the fan fixed thereon by a fan frame 1a. Please refer to FIG. 1, the fan is fixed by a plurality of combined parts 11a and a limited part 12a, but it is not convenient for the above method to assemble and disassemble. The fan may depart from the electronic product, even the components of the fan frame 1a may crack by improper external force during assembling or disassembling process.

Figure 2:
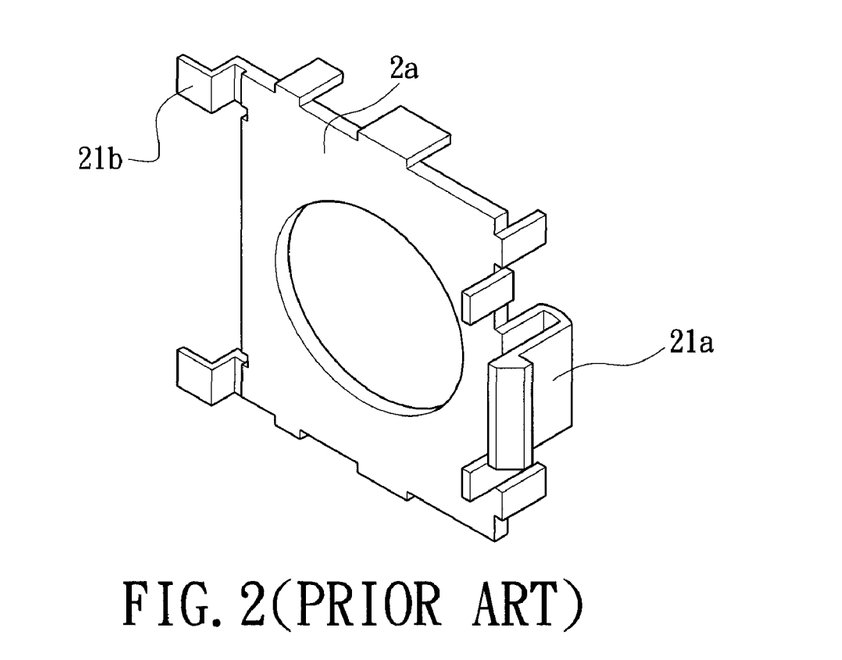
FIG. 2 is a schematic view showing another traditional fan frame.
Figure 3:
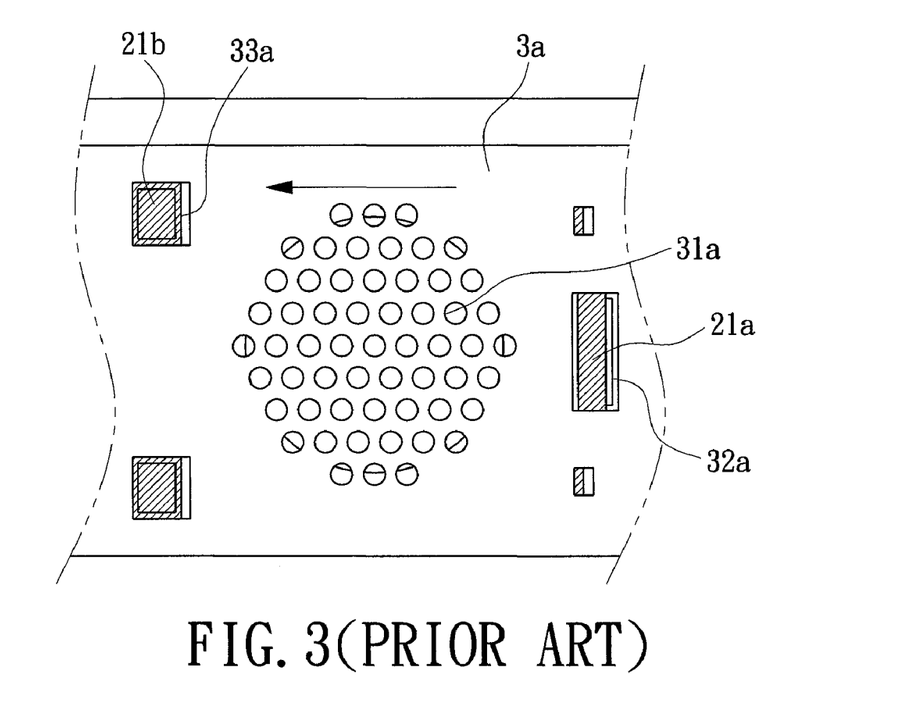
FIG. 3 is a schematic view showing another traditional fan frame installed on an installation panel.

Please refer to FIG. 2 and FIG. 3, the Taiwan Patent No. M296593 discloses an elastic pressing part 21a disposed on a fan frame 2a to position fastening parts 21b. However, the elastic pressing part 21a is a "U" shape hook, perpendicularly connected to the fan frame 2a, and would generate elastic recovery force when deformed. The elastic pressing part 21a may crack by improper external force, or becomes fatigue after a long-time use. As a result, the effect of the elastic pressing part 21a is reduced greatly. After installation, the fan frame 2a also can not avoid falling from the installation panel 3a.

In addition, except the in/out wind holes 31a, the installation panel 3a mush have other holes 32a, 33a to be matched with the elastic pressing part 21a and the fastening parts 21b. The elastic pressing part 21a and the fastening parts 21b can not apply to varied installation panel.

Besides, the holes 32a, 33a limit the installation location of the fan frame 2a, and therefore users can not install the fan frame 2a on the location with higher heat.

Furthermore, the holes 32a, 33a, the elastic pressing part 21a, and the fastening parts 21b would limit the size of the fan.

In order to overcome the above-mentioned problems, the present inventor proposes a novel and reasonable structure based on his delicate researches and expert experiences.

SUMMARY OF THE INVENTION

An objective of the present invention is to provide a fan-fixing device. It is more convenient to assemble or disassemble. It can prevent the fan from falling, and apply to varied fans, casing, or other electronic devices.

To achieve the above objectives, the present invention provides a fan-fixing device for fixing at least one fan on an installation panel with a plurality of holes. The fan-fixing device includes a body, a driving part, and an elastic assembly. The body has a fixing portion, at least one track formed on a side thereof, and. at least one first combined part disposed on an opposite side thereof. The first combined part can penetrate through at least one of the holes. The driving part is slidably disposed in the track. The driving part has at least one second combined part. The second combined part can penetrate through at least another one of the holes. The elastic assembly is arranged between the body and the driving part.

For further understanding of the present invention, reference is made to the following detailed description illustrating the embodiments and examples of the present invention. The description is for illustrative purpose only and is not intended to limit the scope of the claims which are the only full description of the scope of this invention.

DETAILED DESCRIPTION OF THE PREFERRED EMBODIMENTS

Figure 4:
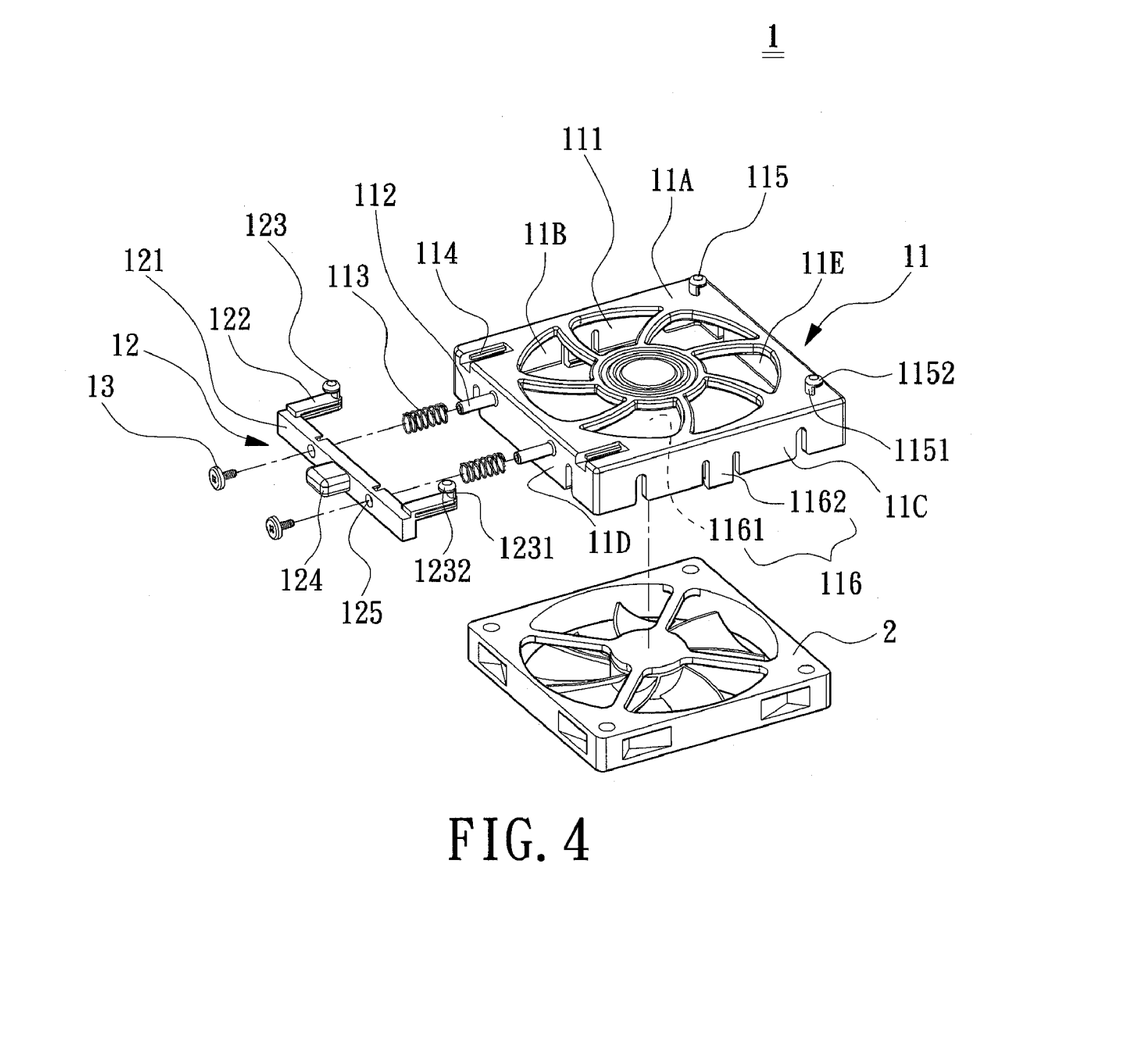
FIG. 4 is an exploded perspective view showing a first embodiment of the present invention.

Reference is made to FIG. 4. The fan-fixing device 1 includes a body 11, a driving part 12, and an elastic assembly arranged between the body 11 and the driving part 12.

The body 11 has a first side 11A, a second side 11B, a third side 11C, a fourth side 11D and a fifth side 11E, which can be shaped into a cuboid, but the shape of the body 11 is not limited. The first side 11A has at least one wind hole 111. FIG. 4 shows several wind holes 111. Two opposite edges of the first side 11A are adjacent to the second side 11B and the third side 11C. The fourth side 11D has edges connected to the first side 11A, the second side 11B and the third side 11C. The elastic assembly includes at least one joint part 112 arranged on the fourth side 11D and at least one elastic parts 113. FIG. 4 shows two joint parts 112. The two joint parts 112 penetrate the two elastic parts 113 respectively, but the number of the elastic part 113 is not limited. In this embodiment, the elastic parts 113 are springs.

The body 11 has at least one track 114 formed on the connection between the first side 11A and the fourth side 11D. FIG. 4 shows two tracks 114 and the two tracks 114 are opposite to each other, but the number and the location of the two tracks 114 are not limited. The body 11 has at least one first combined part 115 disposed on the first side 11A and opposite to the two tracks 114. FIG. 4 shows two first combined parts 115. Each of the first combined parts 115 includes a pillar 1151 and a retaining ring 1152 connected therewith. The pillar 1151 and the retaining ring 1152 can be as a single functional unit or two individual functional units. As shown in figures, the first combined part 115 is shaped into "L", but "T" or other shapes are available.

The body 11 has a fixing portion 116 for fixing at least one fan 2 (The fan is axial-flow type, cross-flow type, or others). FIG. 4 shows one fan 2. The fixing portion 116 has an accommodating space 1161 surrounded by the first side 11A to the fifth side 11E, and at least one fastening part 1162 (which can be a hook) disposed on the second side 11B and the third side 11C. FIG. 4 shows one fastening part 1162 on each of the two sides. In this embodiment, the accommodating space 1161 is bigger than the fan 2. Instead of the accommodating space 1161, the fan 2 can be attached to the body 11 directly, and fixed by a hook or other fixing portion (not shown in figures).

At least one wire hole (not shown in figures) can be disposed at the fifth side 11E for the power wires or controlling wires of fan 2 passing through, but not to limit it. The wire hole can be disposed on other sides (11A-11D), or adjacent site between two sides.

However, it is worth mentioning that the sides (11A-11E) are convenient for describing, not to limit it.

The driving part 12 has a driving portion 121 and at least one track-matched part 122. FIG. 4 shows two track-matched parts 122. The driving portion 121 and the two track-matched parts 122 can be as a single functional unit (integral) or two individual functional units (separable). As shown in figures, the two track-matched parts 122 are disposed on the opposite sides of the driving portion 121, but not limit to it. A second combined part 123 is disposed at one end of the track-matched part 122 and opposite to the driving portion 121. The number and the position on the track-matched part 122 of the second combined part 123 are not limited. Each of the two second combined part 123 has a pillar 1231 and a retaining ring 1232 connected therewith, but not limit to it. The pillar 1231 and the retaining ring 1232 can be as a single functional unit (integral) or two individual functional units (separable). As shown in figures, the second combined part 115 is shaped into "L", but "T" or other shapes are available. The driving portion 121 further has a pressing part 124 and two first holes 125.

Figure 5:
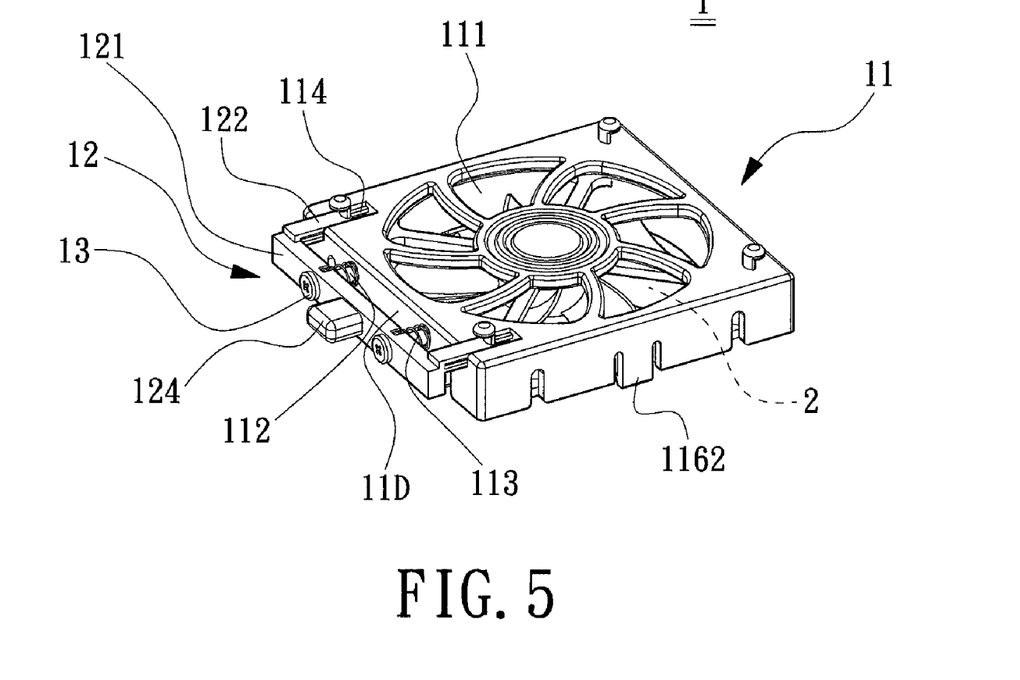
FIG. 5 is an assembled perspective view showing the first embodiment of the present invention.
Figure 6:
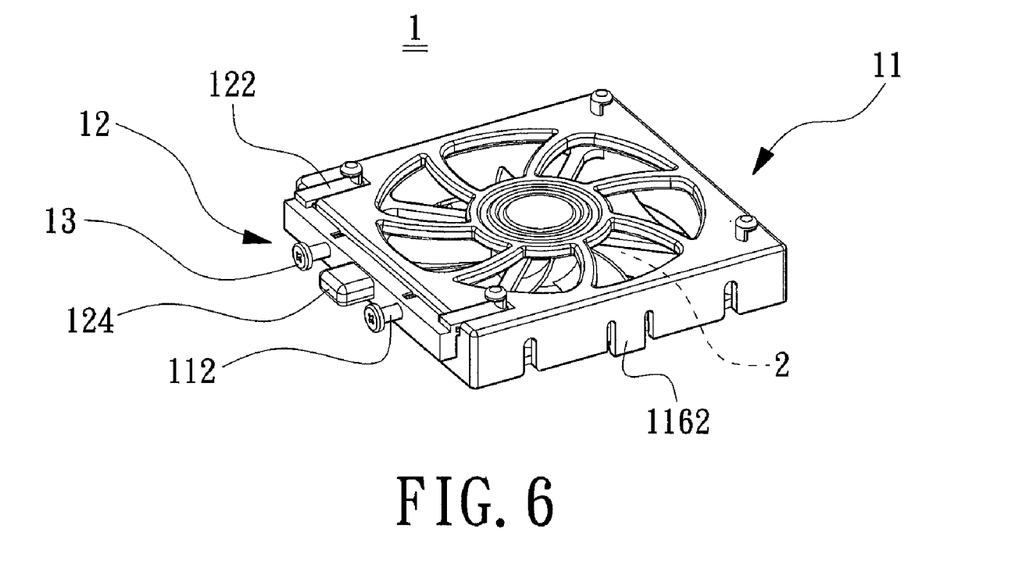
FIG. 6 is another assembled perspective view showing the first embodiment of the present invention.

Reference is made to FIG. 5 and FIG. 6. The method to assemble the fan-fixing device with a fan 2 is as follows. The fan 2 is disposed in the accommodating space 1161. In the meantime, the fastening part 1162 locks the frame 21 of the fan 2 and prevents the fan 2 falling. Moreover, the wind holes 111 are according to an air passage of the fan 2 (not shown in figures).

The two track-matched parts 122 can enter into the two tracks 114 of the body 11, and then the two joint parts 122 penetrate through the two first holes 125. The two elastic parts 113 are disposed between the fourth side 11D of the body 11 and the driving portion 121 of the driving part 12. The more the driving part 12 moves toward the body 11, the larger portion of the two joint parts 122 pass through the two first holes 125.

Moreover, the two joint parts 122 are fixed by two fixed parts 13, and the assembling process of the fan-fixing device 1 is complete. The two joint parts 122 can be two hollow sleeves with threads, and the two fixed parts 13 can be two screws, but not limit to it.

When pushing the driving part 12 or the pressing part 124 toward the body 11 by force, the two joint parts 112 penetrate through the two first holes 125 of the driving portion 121, and then drives the two joint parts 122 enter into the two tracks 114. The two elastic parts 113 are pressed between the driving portion 121 and the fourth side 11D of the body 11. When releasing the force, the two elastic parts 113 will restore and make the driving portion 121 of the driving part 12 leave from the body 11, and then make the two joint parts 113 leave from the two tracks 114. The driving part 12 is stopped until the driving portion 121 is against to the two fixed parts 13. It is convenient to operate.

Figure 7:
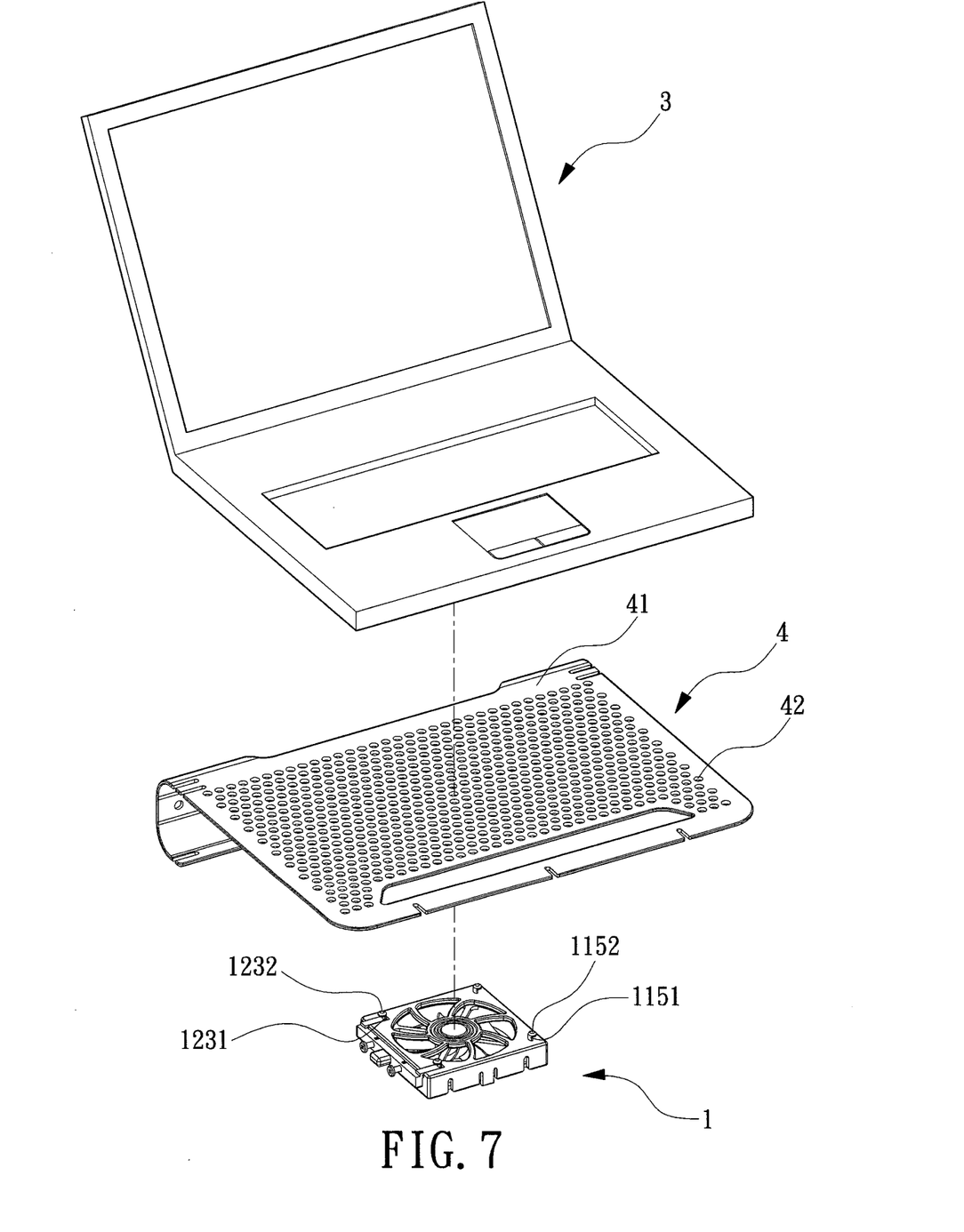
FIG. 7 is an application view showing the first embodiment of the present invention.
Figure 8:
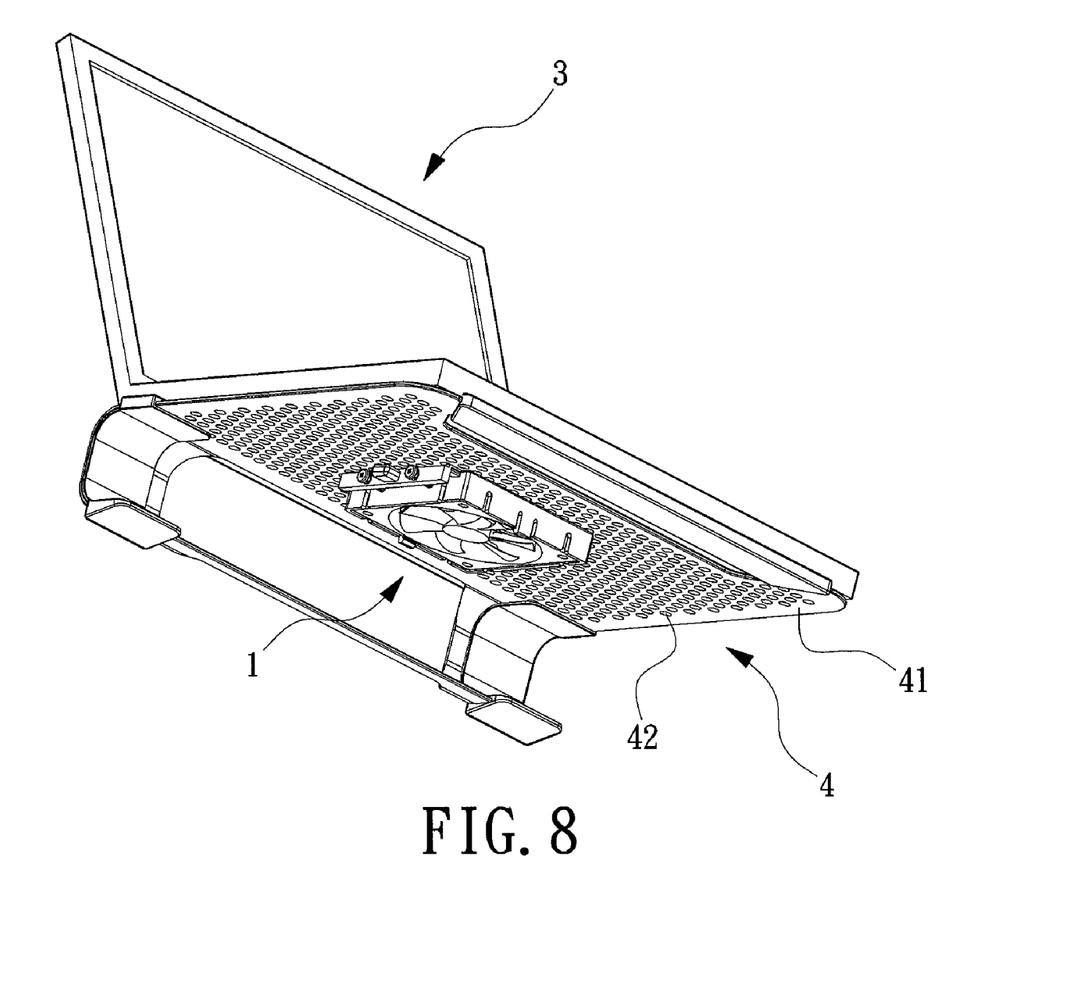
FIG. 8 is another application view showing the first embodiment of the present invention.

Reference is made to FIG. 7 and FIG. 8. A portable device 3 (for example a notebook) has a loading device 4 disposed under it. The loading device 4 is made of metal or plastic. The loading device 4 has an installation panel 41 with a plurality of holes 42. The fan-fixing device 1 can be assembled with the loading device 4. The steps are as follows.

As shown in figures, the diameter of the retaining rings 1152, 1232 are bigger than that of the pillars 1151, 1231 and slightly smaller than the holes 42 of the loading device 4, but not limit to it.

Figure 9A:
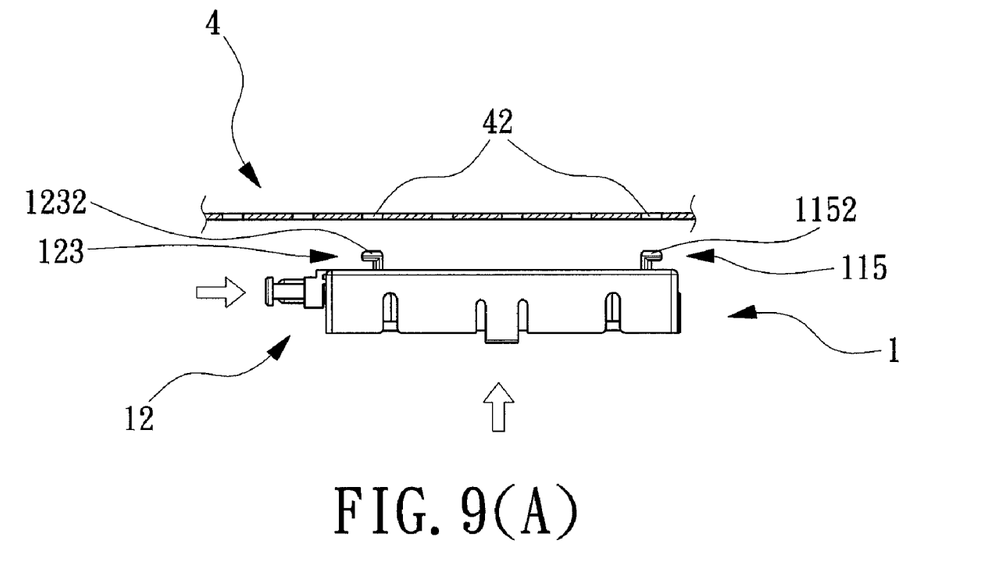
FIGS. 9(A) and (B) are schematic view showing the assembly process of the first embodiment of the present invention.
Figure 9B:
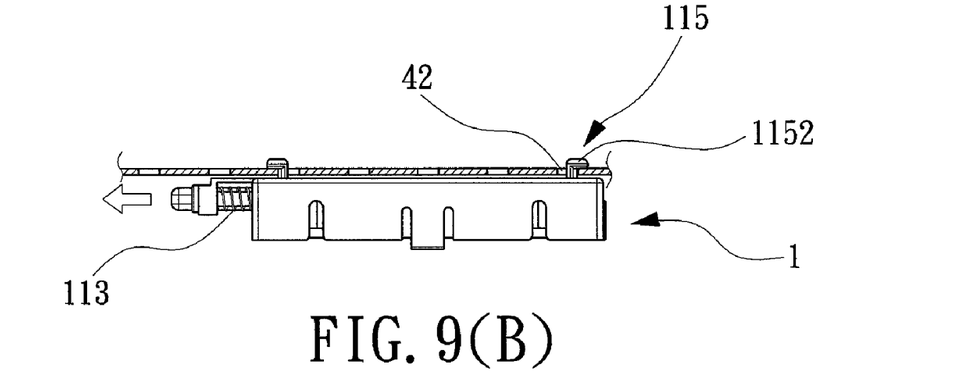

Reference is made to FIG. 9(A) and FIG. 9(B). Users can dispose the two first combined parts 115 on the proper two holes 42 of the loading device 4. The retaining rings 1152 penetrate through the two holes 42. In the meantime, the two first combined parts 115 are movable in the two holes 42.

When the driving part 12 or the pressing part 124 is pushed toward the body 11 by force (for example using a finger), the two joint parts 112 penetrate through the two first holes 125 of the driving portion 121, and then drive the two joint parts 122 enter into the two tracks 114. The two elastic parts 113 are pressed between the driving portion 121 and the fourth side 11D of the body 11. The two second combined parts 123 are disposed in another two proper holes 42 of the loading device 4 via the two retaining rings 1232 penetrating through the two holes 42. In the meantime, the two second combined parts 123 are movable in the two holes 42.

When releasing the force, the two elastic parts 113 will restore and drive the driving portion 121 of the driving part 12 leave from the body 11. The two first combined parts 115 and the two second combined parts 123 are against to the one side of inner wall of the holes 42, and therefore the driving portion 121 of the driving part 12 is stopped. The first combined parts 115 are opposite to the driving part 12, and the second combined parts 123 are close to the driving part 12. Because the diameter of the retaining rings 1152, 1232 are slightly smaller than the holes 42, so that the two first combined parts 115 and the two second combined parts 123 do not leave from the holes 42. As a result, the fan-fixing device 1 is fixed and assembled with the loading device 4.

The above description is to assemble one fan-fixing device 1 with the loading device 4, but the number of the fan-fixing device 1 is not limited. In other words, users can assemble several fan-fixing devices 1 with the loading device 4.

Figure 10A:
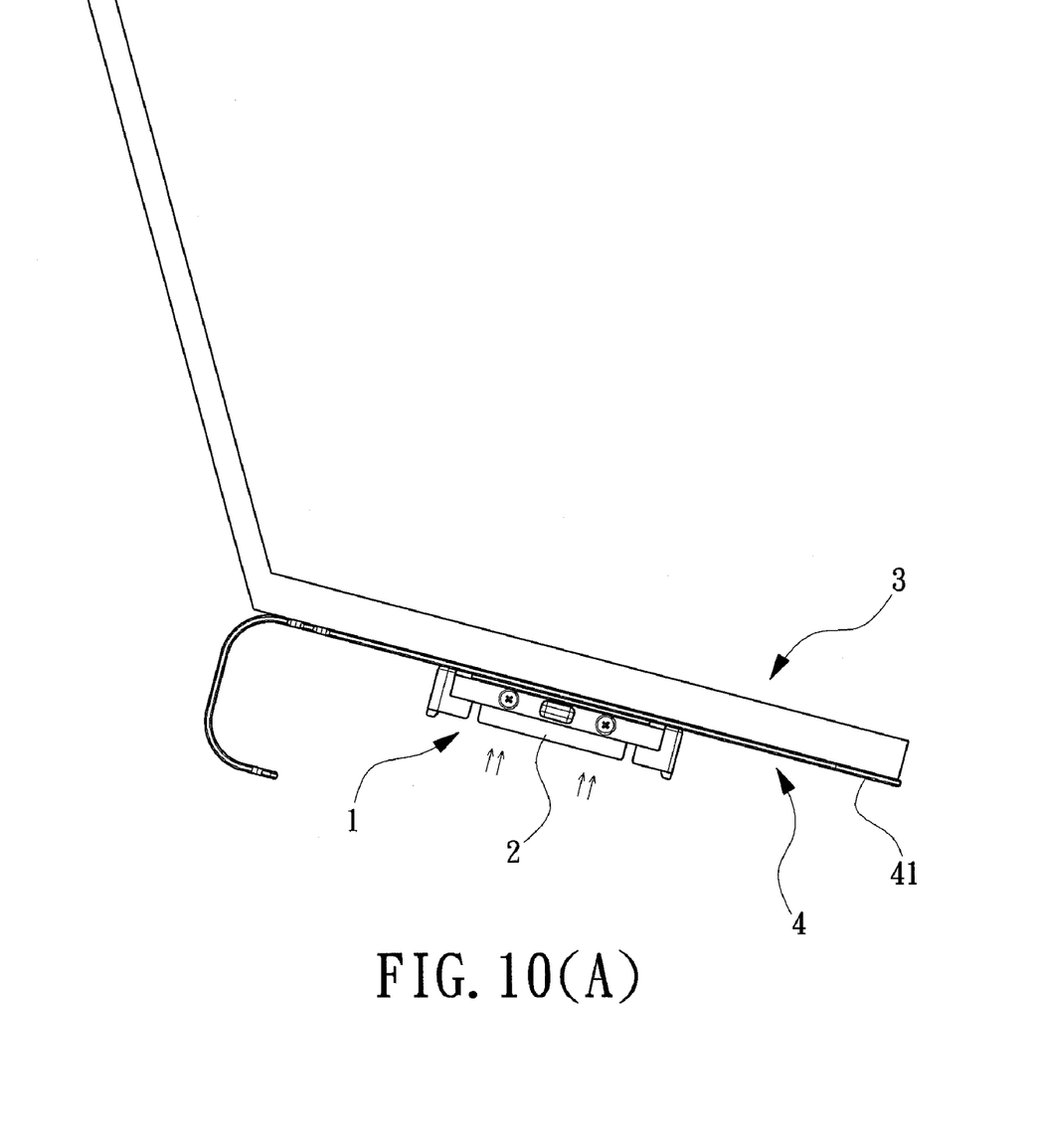
FIGS. 10(A) and (B) are schematic view showing the operating process of the first embodiment of the present invention.
Figure 10B:
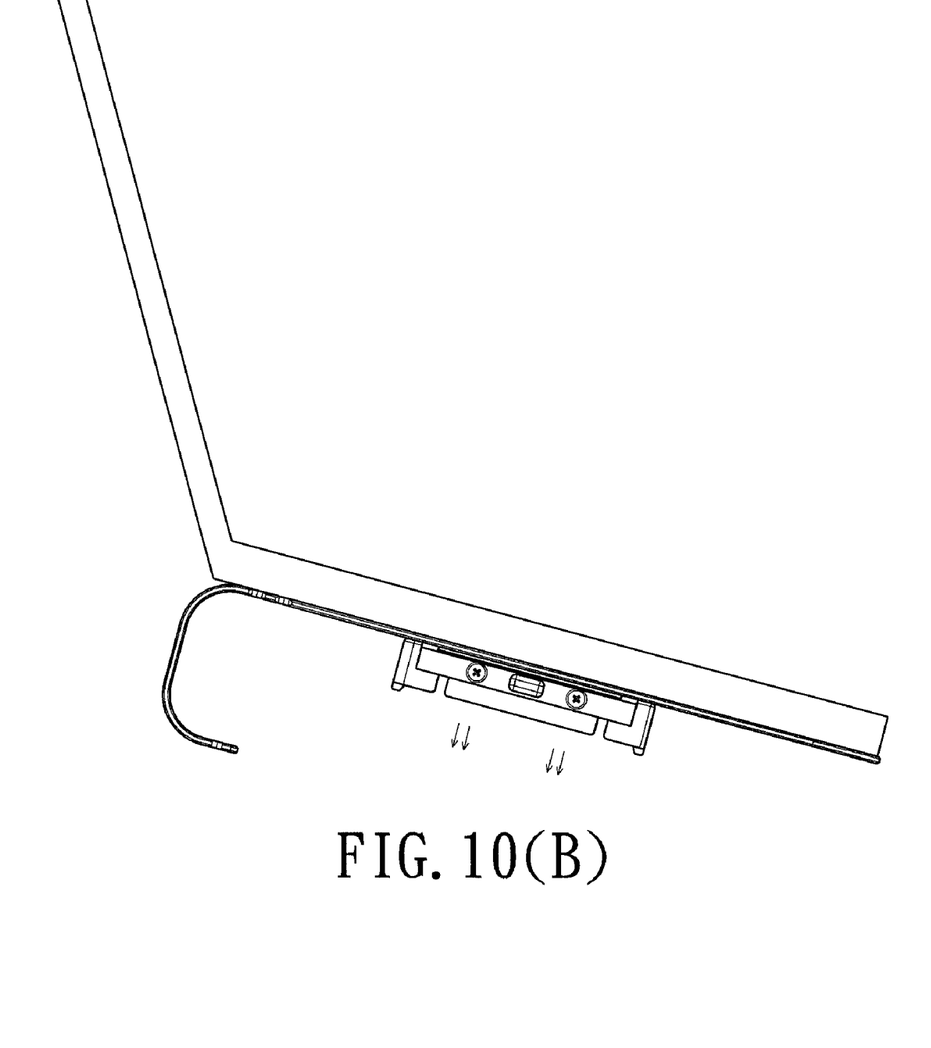

Reference is made to FIG. 10(A) and FIG. 10(B). The area which the fan-fixing device 1 disposed on the installation panel of the loading device 4 is corresponding to the heat source of the portable device 3, so that the portable device 3 can dissipate heat via switching on the fan 2. There are two methods to dissipate heat:

1. The fan 2 inhales external cold air, the cold air passes through the wind holes 111, the holes 42 and then blows into the portable device 3 for dissipating heat. The heat generated from the heat source is at the bottom of the portable device 3.

2. The fan 2 inhales heat from the heat source of the portable device 3. The heat passes through the holes 42, the wind holes 111, and then blows out. The above two methods have good effect for dissipating heat, but not limit to it.

Figure 11A:
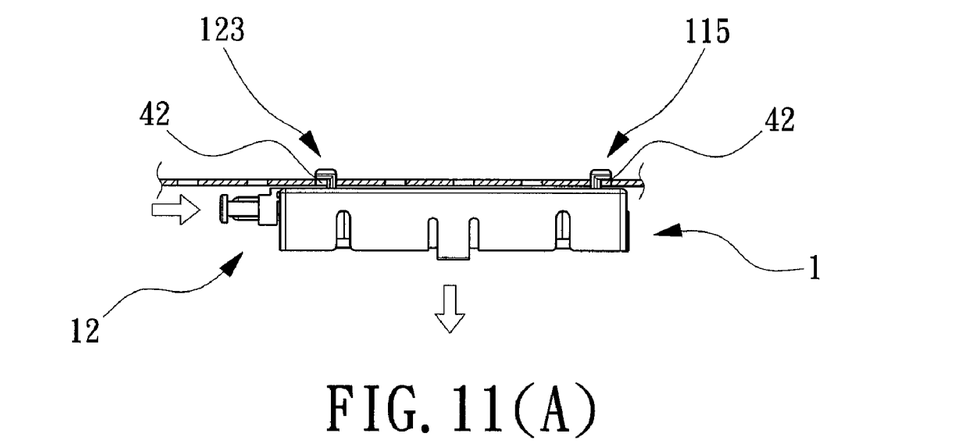
FIGS. 11(A) and (B) are schematic view showing the disassembly process of the first embodiment of the present invention.
Figure 11B:
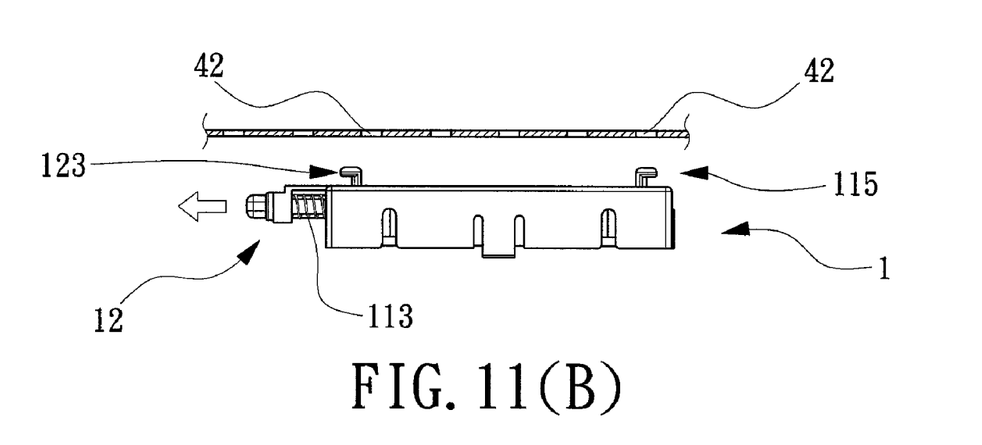

Reference is made to FIG. 11(A) and FIG. 11(B). The process to disassembling the fan-fixing device 1 from the loading device 4 is as follows.

Providing force (using a finger) to push the driving part 12 toward the body 11 or push the pressing part 124 of the driving part 12 directly. The two joint parts 112 penetrate through the two first holes 125 of the driving portion 121, and then drive the two track-matched parts 122 enter into the two tracks 14. The two elastic parts 113 are pressed between the driving portion 121 and the fourth side 11D of the body 11, and the two second combined parts 123 leave from the side of inner wall of the holes 42. In the meantime, the two second combined parts 123 are movable in the holes 42, and can move out from the holes 42. The fan-fixing device 1 is disassembled from the loading device 4.

It is worth mentioning, except the loading device 4, and the fan-fixing device 1 also can be applied to an electronic device's casing or other devices with heat-dissipating holes (not shown in figures).

Figure 12:
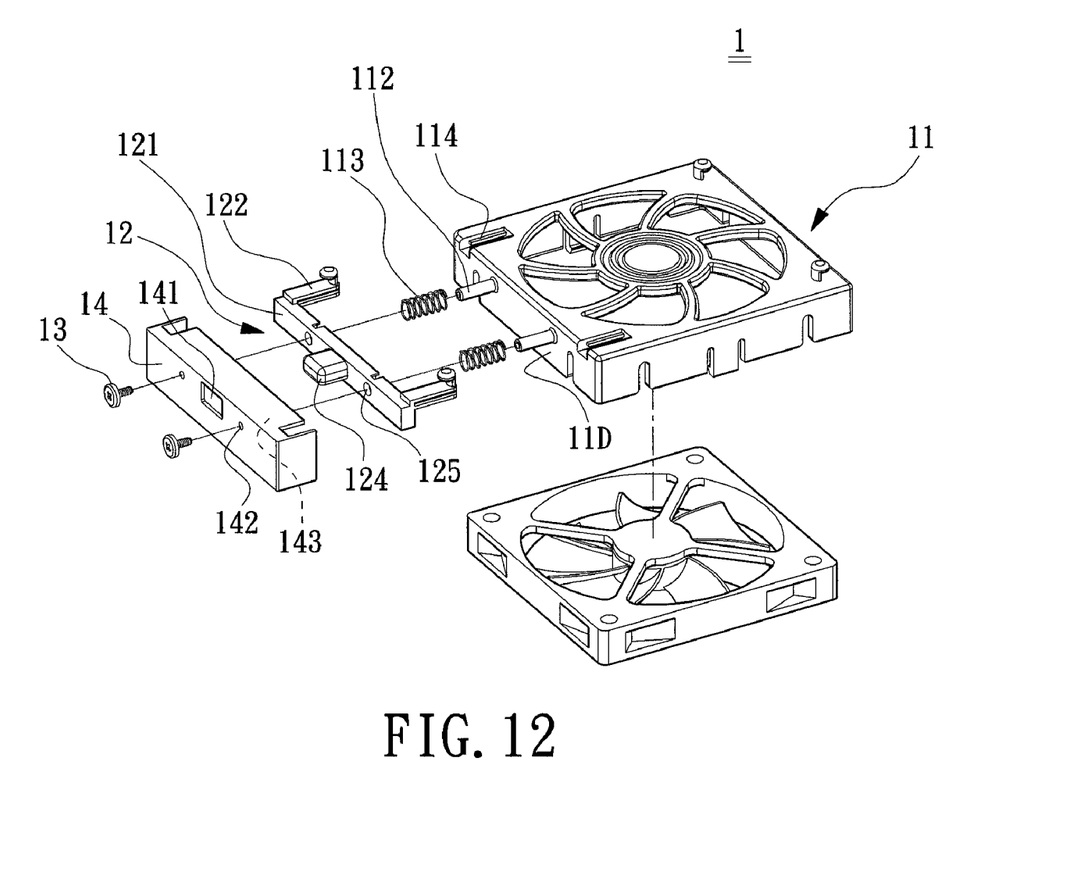
FIG. 12 is an exploded perspective view showing a second embodiment of the present invention.

Reference is made to FIG. 12. The differences between two embodiments are as follows.

The fan-fixing device 1 further has an external part 14. The external part 14 has at least one through hole 141, at least one second hole 142, and a hollow portion 143. FIG. 12 shows one through hole 141 and two second holes 142. The through hole 141 is bigger than the pressing part 124 of the driving part 12. The hollow portion 143 is bigger than the driving portion 121.

Figure 13:
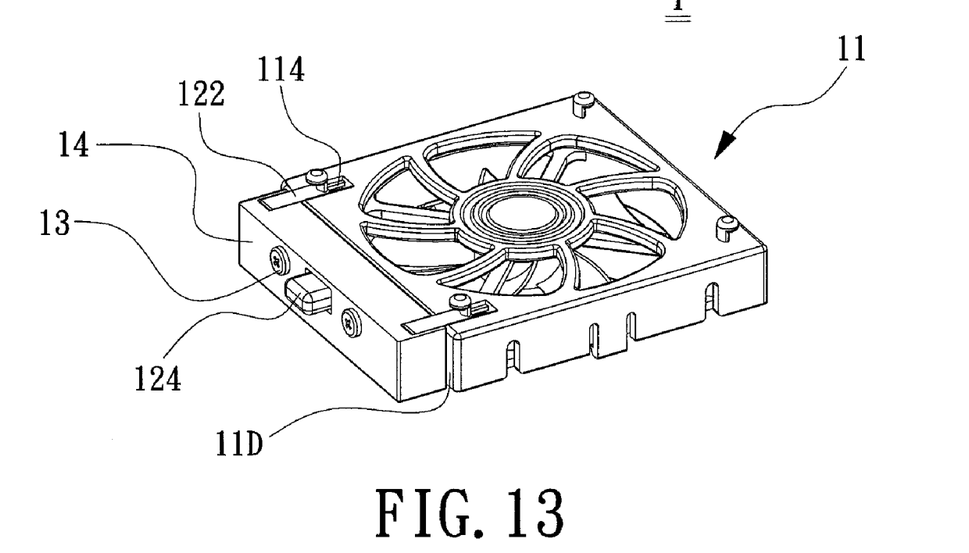
FIG. 13 is an assembled perspective view showing the second embodiment of the present invention.
Figure 14:
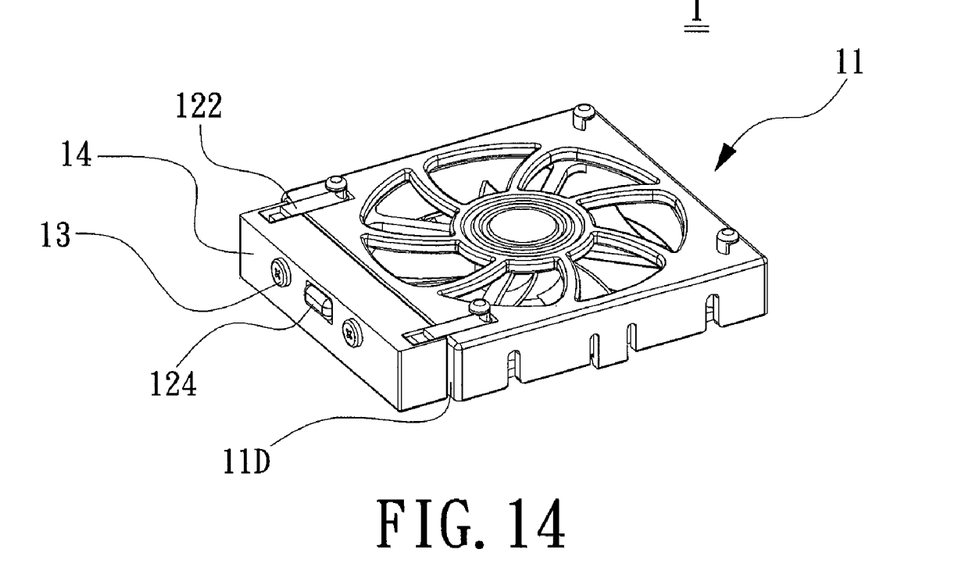
FIG. 14 is another assembled perspective view showing the second embodiment of the present invention.

Reference is made to FIG. 13 and FIG. 14. The differences of the assembling method between the two embodiments are as follows.

The through hole 141 of the external part 14 is for the pressing part 124 penetrating through, so that the driving portion 121 of the driving part 12 is disposed in the hollow portion 143. The two first holes 125 are corresponding to the two second holes 142. The two joint parts 112 of the driving part 12 penetrate the two first holes 125 of the driving part 12 and the two second holes 142 of the external part 14.

At this time, the two joint parts 122 can be fixed by the two fixed parts 13. The two joint parts 122 can be two hollow sleeves with threads, and the two fixed parts 13 can be two screws, but not limit to it. The driving portion 121 of the driving part 12 is attached to the inner wall of the external part 14.

When providing force to push the driving part 12 toward the body 11 or push the pressing part 124 of the driving part 12, the driving portion 121 would leave from the hollow portion 143 of the external part 14. The two joint parts 112 penetrate through the two first holes 125, and then drive the two track-matched parts 122 enter into the two tracks 114. The two elastic parts 113 are pressed between the driving portion 121 and the fourth side 11D of the body 11. When releasing the force, the two elastic parts 113 will restore and make the driving portion 121 of the driving part 12 leave from the body 11, and then make the two joint parts 113 leave from the two tracks 114. The driving part 12 is stopped until the driving portion 121 enters into the hollow portion 143 and is against to the inner wall of the external part 14.

The fan-fixing device of the present invention has the following characteristics.

1. The driving part has a horizontal movement. It is easy to push and prevents components from broken by improper force.

2. The first combined parts and the second combined parts can prevent the fan-fixing device departing from the electronic device.

3. Users can easily change the fatigued elastic parts.

4. The external part can cover some components to make it beautiful.

5. The fan-fixing device is assembled or disassembled on the installation panel of the loading device.

6. The installation panel of the loading device is no need to dispose other holes to set the fan-fixing device.

7. The fan-fixing device can be applied to varied sizes of fans via the first combined parts and the second combined parts assembled in the holes of the installation panel.

8. Users can change the fan-fixing device to the proper location of the installation panel according to their need, so as to get better heat-dissipating effect.

9. Except the loading device, the fan-fixing device can be applied to an electronic device's casing or other devices with heat-dissipating holes.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A fan-fixing device for fixing at least one fan on an installation panel with a plurality of holes, comprising:
   a body having a fixing portion for fixing the at least one fan, at least one track formed on a side thereof, and at least one first combined part disposed on an opposite side thereof, wherein the at least one first combined part penetrates at least one of the holes of the installation panel;
   a driving part slidably disposed on the track, the driving part having at least one second combined part, wherein the at least one second combined part penetrates at least another one of the holes;
   an elastic assembly arranged between the body and the driving part, the elastic assembly having at least one joint part protruded from the body and at least one elastic part, wherein the at least one joint part penetrates the at least one elastic part, wherein the driving part has a driving portion and at least one track-matched part entering into the track, and the driving part is slidably disposed on the track; and
   an external part having at least one second hole, wherein the driving portion has at least one first hole, the joint part penetrates the first hole and the second hole, and at least one fixed part assembled with the joint part for fixing the external part.

2. The fan-fixing device as claimed in claim 1, wherein the fixing portion has an accommodating space for accommodating the fan and a plurality of fastening parts for fastening an outer frame of the fan.

3. The fan-fixing device as claimed in claim 1, wherein the first combined part has a pillar and a retaining ring connected therewith.

4. The fan-fixing device as claimed in claim 1, wherein the driving portion has at least one first hole which the at least one joint part penetrates, and at least one fixed part is assembled with the joint part for fixing the driving portion.

5. The fan-fixing device as claimed in claim 1, wherein the driving portion further has a pressing part for pushing.

6. The fan-fixing device as claimed in claim 1, wherein the second combined part has a pillar and a retaining ring connected therewith.

7. The fan-fixing device as claimed in claim 1, wherein the body further has at least one wind hole according to an air passage of the fan.

8. The fan-fixing device as claimed in claim 1, wherein the driving portion has a pressing part, the external part has a through hole for the pressing part penetrating through.

* * * * *